(12) United States Patent
Chen et al.

(10) Patent No.: US 9,818,863 B2
(45) Date of Patent: *Nov. 14, 2017

(54) INTEGRATED BREAKDOWN PROTECTION

(71) Applicant: Freescale Semiconductor, Inc., Austin, TX (US)

(72) Inventors: Weize Chen, Phoenix, AZ (US); Hubert M. Bode, Haar (DE); Richard J. De Souza, Chandler, AZ (US); Patrice M. Parris, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 31 days.

This patent is subject to a terminal disclaimer.

(21) Appl. No.: 14/990,765

(22) Filed: Jan. 7, 2016

(65) Prior Publication Data

US 2016/0118495 A1    Apr. 28, 2016

Related U.S. Application Data

(63) Continuation of application No. 13/448,994, filed on Apr. 17, 2012, now Pat. No. 9,236,472.

(51) Int. Cl.
*H01L 29/78* (2006.01)
*H01L 29/66* (2006.01)
*H01L 29/06* (2006.01)
*H01L 29/10* (2006.01)
(Continued)

(52) U.S. Cl.
CPC ...... *H01L 29/7823* (2013.01); *H01L 21/2253* (2013.01); *H01L 29/0626* (2013.01); *H01L 29/0865* (2013.01); *H01L 29/0882* (2013.01); *H01L 29/1083* (2013.01); *H01L 29/1095* (2013.01); *H01L 29/66659* (2013.01); *H01L 29/66681* (2013.01); *H01L 29/7824* (2013.01); (Continued)

(58) Field of Classification Search
CPC ............ H01L 21/2253; H01L 29/0626; H01L 29/0653; H01L 29/0865; H01L 29/0882; H01L 29/1083; H01L 29/1087; H01L 29/1095; H01L 29/66659; H01L 29/66681; H01L 29/7823; H01L 29/7824; H01L 29/7835
See application file for complete search history.

(56) References Cited

U.S. PATENT DOCUMENTS

| 5,925,910 A | 7/1999 | Menegoli |
| 6,909,143 B2 | 6/2005 | Jeon et al. |
| 6,924,531 B2 | 8/2005 | Chen et al. |

(Continued)

*Primary Examiner* — Bilkis Jahan
*Assistant Examiner* — Victor Barzykin

(57) ABSTRACT

A device includes a semiconductor substrate having a first conductivity type, a device isolating region in the semiconductor substrate, defining an active area, and having a second conductivity type, a body region in the active area and having the first conductivity type, and a drain region in the active area and spaced from the body region to define a conduction path of the device, the drain region having the second conductivity type. At least one of the body region and the device isolating region includes a plurality of peripheral, constituent regions disposed along a lateral periphery of the active area, each peripheral, constituent region defining a non-uniform spacing between the device isolating region and the body region. The non-uniform spacing at a respective peripheral region of the plurality of peripheral, constituent regions establishes a first breakdown voltage lower than a second breakdown voltage in the conduction path.

20 Claims, 8 Drawing Sheets

(51) Int. Cl.
   *H01L 21/225* (2006.01)
   *H01L 29/08* (2006.01)

(52) U.S. Cl.
   CPC ...... *H01L 29/7835* (2013.01); *H01L 29/0653* (2013.01); *H01L 29/1087* (2013.01)

(56) References Cited

U.S. PATENT DOCUMENTS

| | | |
|---|---|---|
| 6,927,452 B2 | 8/2005 | Shin et al. |
| 7,279,768 B2 | 10/2007 | Kanda et al. |
| 7,439,584 B2 | 10/2008 | Khemka et al. |
| 7,608,513 B2 | 10/2009 | Yang et al. |
| 7,683,426 B2 | 3/2010 | Williams et al. |
| 7,719,054 B2 | 5/2010 | Williams et al. |
| 7,741,661 B2 | 6/2010 | Disney et al. |
| 7,812,393 B2 | 10/2010 | Williams et al. |
| 7,915,676 B2 | 3/2011 | Jensen et al. |
| 7,956,391 B2 | 6/2011 | Disney et al. |
| 8,314,458 B2 | 11/2012 | Otake |
| 8,471,337 B2 | 6/2013 | Jensen et al. |
| 8,541,862 B2 | 9/2013 | Yang et al. |
| 2004/0232510 A1 | 11/2004 | Petruzzello et al. |
| 2008/0197408 A1 | 8/2008 | Disney et al. |
| 2008/0230812 A1 | 9/2008 | Disney et al. |
| 2009/0224333 A1 | 9/2009 | Lu et al. |
| 2010/0025765 A1 | 2/2010 | Yang et al. |
| 2010/0084686 A1 | 4/2010 | Cai et al. |
| 2010/0133611 A1 | 6/2010 | Disney et al. |
| 2010/0163990 A1 | 7/2010 | Ko |
| 2011/0169564 A1 | 7/2011 | Jensen et al. |
| 2012/0187484 A1 | 7/2012 | Cho et al. |
| 2013/0093016 A1 | 4/2013 | Ko et al. |
| 2013/0093017 A1 | 4/2013 | Ko |
| 2013/0134511 A1 | 5/2013 | Yang et al. |

INTEGRATED BREAKDOWN PROTECTION

CROSS-REFERENCE TO RELATED APPLICATION

This application is a continuation application of U.S. application Ser. No. 13/448,994, entitled "Semiconductor Device with Integrated Breakdown Protection" and filed Apr. 17, 2012, the entire disclosure of which is hereby incorporated by reference.

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices may be designed to prevent a direct punch-through path from a body region of the LDMOS device to an underlying substrate.

LDMOS devices are often used in applications, such as automotive applications, involving operational voltages greater than 45 Volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Breakdown events may nonetheless occur at an intrinsic location along the current conduction path between the drain and source of an LDMOS device. Such intrinsic breakdown events often lead to device degradation or failure. One technique for avoiding intrinsic breakdown involves clamping the drain voltage with a second device in parallel with the LDMOS device. The drain voltage is clamped to a level between the expected operating voltage of the LDMOS device and the intrinsic breakdown voltage of the LDMOS device. The second device undesirably leads to additional fabrication costs.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
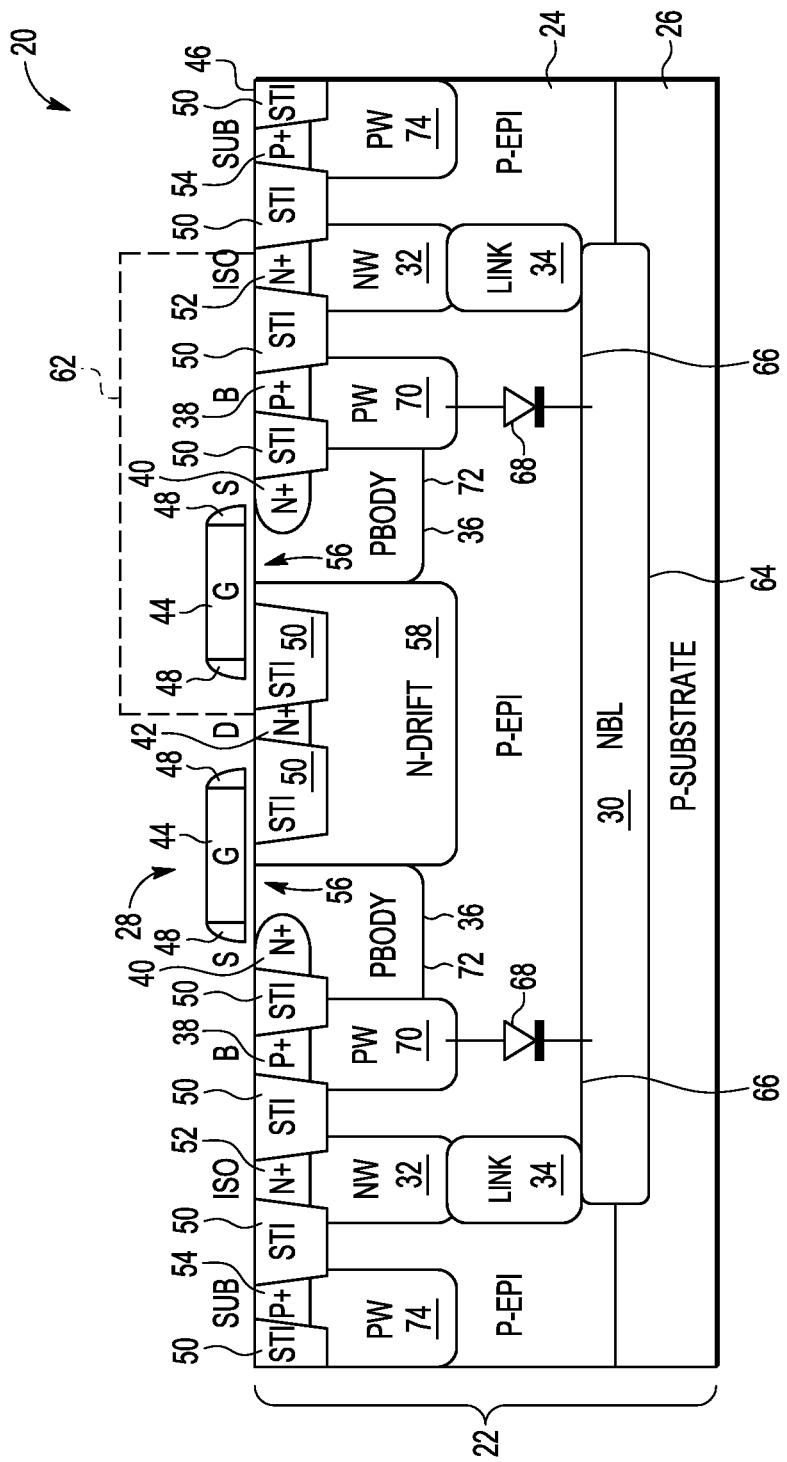
FIGS. 1-5 are cross-sectional, schematic views of exemplary n-channel LDMOS transistors with integrated breakdown protection diodes in accordance with several embodiments.

The disclosure relates to LDMOS and other power transistor devices and electronic apparatus configured with one or more integrated breakdown protection diodes. Each protection diode may include or correspond with a junction having a breakdown voltage configured to protect a channel or other conduction region or path of the device. Each protection diode may be electrically tied or clamped to the power transistor device (e.g., in a parallel configuration) to experience the voltage applied to the terminals of the power transistor device. The junction of the protection diode is configured to breakdown at a voltage level lower than a breakdown voltage of the power transistor device near the conduction path. Breakdown protection is thus provided by relocating the site of the breakdown event rather than by trying to prevent breakdown from occurring altogether. The relocation moves the breakdown site from the conduction path to the location of the diode or junction. As described below in connection with several examples, the protection diode or junction is not disposed in (e.g., is spaced from) a normal conduction path of the device. A breakdown event (e.g., an electrostatic discharge (ESD) event) occurring at such diodes or junctions is thus non-destructive to normal device operation, as described below.

The protection diode or junction may nonetheless be internal or integrated into an interior or active area of the device. In such cases, the protection diode is not disposed in, for example, an end termination region of the device. The internal nature and/or other aspects of the integration may allow the protection diode to scale with device size (e.g., transistor width). The internal nature of the integration may also allow the breakdown protection to be provided without requiring an increase in device footprint or overall size.

The integration may be achieved in some embodiments without adding fabrication steps to the fabrication process. In some embodiments, the integration of the protection diode is achieved via a modification to a pre-existing mask layout. For example, the protection diode may be formed via a layout change in a pre-existing implantation step directed to forming an isolating region or a body region of the device. The pre-existing implantation step may alternatively be directed to the formation of a logic device (e.g., a CMOS transistor). In some embodiments, a separate implant or other formation fabrication step may thus be avoided.

The protection diode or junction may be integrated with one or more isolating regions of the LDMOS or other device. In some cases, the isolating region(s) are electrically tied or shorted with a drain region to reverse bias the diode or junction with the voltage applied to the drain region. Locating the protection diode at or along the isolating region(s) allows the breakdown to be spaced from a channel or other conduction region of the device. The position and orientation of the isolating region and, thus, the protection diode may vary. In some cases, the isolating region is disposed such that breakdown protection is provided via an internal vertical diode. For example, the isolating region may be a buried layer extending across an active area of the device. With a vertical orientation, the breakdown protection may be insensitive to photolithographic misalignment. In other cases, breakdown protection is provided via an isolating region that leads to a lateral protection diode. The isolating region in such cases may include or involve an isolation ring surrounding the active area.

In one aspect, the size or area of the protection diode scales or adjusts with transistor width. The scaling or adjustment occurs in either vertical or lateral protection diode configurations. Such size scaling may maintain protection effectiveness when the transistor scales. The protection is thus provided over a wide range of device sizes.

In some embodiments, the breakdown protection is provided by modifying one or more characteristics of a body region of the device. For example, a dopant concentration level in, and/or a depth of, a portion of the body region may be modified. The body region may thus have a non-uniform dopant concentration profile or depth. The portion may be disposed under a body region contact or otherwise spaced from a channel or other conductive region. The portion may be doped via an implant procedure directed to doping wells of other devices, such as logic devices (e.g., CMOS devices). For instance, the contact region of the body region may be exposed or opened during the implant procedure so that the CMOS well implant enters the corresponding portion of the body region. Other procedures may be used to provide a similar transition or non-uniform dopant concentration in the body region (e.g., between regions near the contact and those near the channel region). In some examples, the portion of the body region forms part of a vertical diode. The vertical diode may be formed with an N-type buried layer (NBL) or other well or region disposed underneath the body region. As with other embodiments, the vertical protection diode may scale with the width of the device to maintain the effectiveness of protection.

In some embodiments, the protection diode or junction is oriented laterally and formed with an isolation ring. The construction of the isolation ring may vary. For instance, the isolation ring may include one or more further isolating regions in addition to a ring-shaped well region surrounding the active area of the device, such as a buried layer and an isolation link region that connects the buried layer and the ring-shaped well region. The protection diode may be formed with any one or more of these isolating regions used to isolate the device from the substrate. In some cases, a lateral protection diode includes an epitaxial or other substrate region between a body region of the device and the isolating region (e.g., a ring-shaped well region). By adjusting the width of the epitaxial region, the breakdown voltage of the diode or junction formed by the isolating region and the body region may be set or established to fall between the operating voltage and the breakdown voltage near the drain region and/or channel region (e.g., BVdss). Alternatively, by adjusting the internal extension of an isolation link region relative to the ring-shaped well region above the isolation link region, the disclosed devices may be configured such that the location of the breakdown is between the isolation link region and the body region (e.g., along a diagonal direction below a trench oxide region, thus avoiding possible charge trapping in the trench oxide during a breakdown event).

Another laterally oriented protection diode or junction establishes a breakdown voltage by configuring an isolating region (e.g., a ring-shaped well region) such that a depletion region in the isolating region reaches through and contacts an electrode of the isolating region under sufficiently high reverse bias. The disclosed devices may alternatively or additionally be configured such that the depletion region reaches through and contacts a body electrode (or contact region). In each of these and other internal locations, the protection diode or junction scales with device width.

Although described below in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other device configurations, including, for instance, bipolar transistors. For example, the integrated protection diodes of the disclosed devices may be useful in a wide variety of power electronic devices. The composite field drift regions are also not limited to any one particular type of RESURF configuration. The disclosed devices may have varying RESURF structures, including single, double, or other RESURF structural arrangements, each of which may be referred to herein as a "RESURF transistor."

The breakdown voltage of the protection diode or junction may be tuned or configured to suit a variety of applications. For example, the breakdown voltage of the diode or junction may be established at a level comfortably between and spaced from the operating voltage of the device and the breakdown voltage at or near the channel region and/or drain region (BVdss).

For convenience of description and without any intended limitation, n-channel LDMOS devices are described and illustrated herein. The disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic cross-sectional view of an example of an n-channel field LDMOS device 20 constructed in accordance with one embodiment. The device 20 may be configured as a RESURF transistor. The device 20 includes a semiconductor substrate 22, which may, in turn, include a number of epitaxial layers 24. In this example, the semiconductor substrate 22 includes a single p-type epitaxial layer p-epi grown on an original substrate 26 (e.g., a heavily doped p-type substrate). The device 20 may alternatively or additionally include non-epitaxial layers in which one or more device regions are formed. Any one or more of the layers of the semiconductor substrate 22 may include silicon. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

An active area 28 of the device 20 is depicted in FIG. 1. The active area 28 is defined by one or more isolation layers or regions in the semiconductor substrate 22 (e.g., the epitaxial layer 24). The isolation layer(s) or region(s) may surround the active area 28. These layers or regions act as a barrier or isolation layer separating the active area 28 from the rest of the substrate 22 (or the original substrate 26). In this example, an N-type buried layer (NBL) 30 is formed or disposed in the semiconductor substrate 22, which may be formed in the epitaxial layer 24 thereof. The NBL 30 extends across (e.g., under) the active area 28 of the device 20 to act as a barrier or isolation layer separating the active area 28 from the original substrate 26. The NBL 30 may constitute one of several device isolating regions surrounding the active area 28 of the device 20.

The example depicted in FIG. 1 also includes a heavily doped n-type isolation well 32 laterally surrounding the active area 28. The isolation well 32 may be ring-shaped. The isolation well 32 may be disposed on or otherwise above the NBL 28 and outside of, or along, the lateral periphery of the active area 28 as shown. The isolation well 32 may be formed in conjunction with one or more n-type wells, such as an n-type drift region described below. The isolation well 32 may be connected to the NBL 30 via one or more link regions 34. In this example, the link region 34 is also configured as a ring. In alternative embodiments, the isolation well 32 is configured as a sink that connects to the NBL 30 directly. One or more of the above-described isolating regions may have a dopant concentration level and/or be otherwise configured for high voltage (HV) operation (e.g., high side operation), including punch-through prevention. Any number of the isolation wells, sinks, or buried layers may be connected to one another. Additional, fewer, or alternative isolation layers or regions may be provided in the semiconductor substrate 22.

The device 20 includes a device body or body region 36 in the semiconductor substrate 22. In this example, the body region 36 includes a p-type well formed in the epitaxial layer 24 of the substrate 22. The p-type well may be configured for high voltage operation (e.g., high side operation). The body region 36 is biased via one or more heavily doped p-type body contact regions or electrodes 38 formed in or otherwise above the p-type well of the body region 36 in the semiconductor substrate 22. The dopant concentration of each contact region 38 may be at a level sufficient to establish an ohmic contact to the body region 36. In this embodiment, the body region 36 is a composite region including multiple wells. Further details regarding the body region 36 are provided below.

The device 20 includes heavily doped source and drain regions 40 and 42 in the semiconductor substrate 22. Any number of source or drain regions 40, 42 may be provided. In this example, the source and drain regions 40 and 42 are n-type doped portions of the epitaxial layer 24. The heavily doped n-type source region 40 is disposed within the body region 36. The heavily n-type doped drain region 42 is spaced from the body region 36 to define a conduction path of the device between the source and drain regions 40, 42. The regions 40, 42, or a portion thereof, may have a dopant concentration at a level sufficient to establish ohmic contacts for biasing the source region 40 and the drain region 42. In a typical LDMOS configuration, the drain region 42 is biased at a high voltage, Vds, relative to the source region 40, which may, for example, be considered to be at ground potential.

The device 20 includes one or more gate structures 44 formed on or above a surface 46 of the semiconductor substrate 22. This example includes a pair of gate structures 44 disposed between the source regions 40 and the drain regions 42. Each gate structure 44 is located on or above a gate dielectric (not shown). For example, the gate dielectric may include silicon dioxide (or oxide) deposited or otherwise formed on the surface 46. Each gate structure 44 includes a conductive gate on or above the gate dielectric, which insulates the conductive gate from the substrate 22. Each gate structure 44 may include one or more dielectric sidewall spacers 48 disposed along lateral edges of the gate structure 44. The sidewall spacers 48 may cover the lateral edges to act as a silicide blocker to prevent a silicide short along the surface 46. The sidewall spacers 48 may provide spacing to separate the conductive components of the gate structure 44 from the source region 40 and other regions of the active region 28. In this example, one of the sidewall spacers 48 is used for alignment purposes in defining an edge of the source region 40.

Further details regarding examples of dual-gate structures are described in U.S. Pat. No. 7,608,513 ("Dual Gate LDMOS Device Fabrication Methods") and U.S. Pat. No. 7,795,674 ("Dual Gate LDMOS Devices"). The components, materials, and other characteristics of the gate structures 44 may vary from the example shown. For example, the device 20 need not be configured as a dual-gate device.

A number of shallow trench isolation (STI) regions 50 may be formed at the surface 46 in the semiconductor substrate 22. In this embodiment, two of such STI regions 50 space the gate structures 44 from the high voltage applied to the drain region 42. These and other ones of the STI regions 50 may be configured to prevent or minimize hot carrier injection (HCI) into the oxide layer of the gate structure 44.

Alternatively or additionally, HCI effects may also be minimized by configuring the device 20 with one or more lightly or intermediately doped transition regions (e.g., n-type lightly doped drain, or NLDD, regions) at or near the source and drain regions 40 and 42. Each transition region may be or include a diffused region formed in connection with the source region 40 and/or the drain region 42. Such transition regions may assist in controlling the electric field at or near the surface 46, including in areas other than those areas near the source region 40 or the drain region 42.

Other STI regions 50 may be disposed in the semiconductor substrate 22 to isolate or separate various contact regions, such as the body contact region 38 and the source region 40, as well as other regions for biasing components of the device 20. For example, an isolation contact region 52 and a substrate contact region 54 may be separated by one of the STI regions 50.

When the gate structure 44 is biased, charge carriers (in this case, electrons; alternatively, holes) accumulate in one or more channel areas or regions 56. Each channel region 56 (or a portion thereof) may be located in the body region 36 under the gate structure 44. In this example, the accumulation of electrons results in a charge inversion in the channel region 56 from the p-type body region 36 to an n-type conduction layer or area near the surface 46 of the semiconductor substrate 22. Once a sufficient amount of the charge carriers accumulate in the conduction layer or area, charge carriers can flow from the source region 40 toward the drain region 42 through the channel region 56.

The channel region 56 may include other regions or areas in the semiconductor substrate 22 in which charge inversion or accumulation occurs as a result of the bias applied to the gate structure 44. Charge carriers may also accumulate at the surface 46 of the substrate 22 outside of or beyond the body region 36. For example, charge carriers may accumulate in an area near the surface 46 in a region of the epitaxial layer 24 adjacent the body region 36. This area may, in some cases, be considered to be part of an accumulation region of the device 20. The channel region 56 and the accumulation region may form part of a conduction region or path of the device 20.

The conduction path of the device 20 is not limited to regions in which charge inversion occurs or to regions in which conduction is enabled or enhanced via the bias voltage applied to the gate structure 44. The conduction path or regions of the device 20 are thus not limited to regions at or near the surface 46. For example, the conduction path includes a portion of a field drift region of an LDMOS device through which charge carriers drift to reach the drain region 42. The conduction path of the device 20 may thus include areas or regions having a different conductivity type than the body region 36. In this example, the conduction path may thus include an n-type region, such as an n-type field drift region (or layer or area thereof). Further details regarding the field drift region of the device 20 are set forth below.

The conduction path or regions of the device 20 may include still other regions, whether n-type or p-type, at or near the surface 46. For example, the channel region 56 and/or other conduction region of the device 20 may include one or more intermediately doped n-type transition regions (e.g., one of the NLDD regions described above) in the semiconductor substrate 22. As described below, the device 20 is configured to prevent a breakdown event from occurring at, near, or along the conduction path. Preventing breakdown in these and other conduction regions of the device 20 may allow the device 20 to avoid damage from the breakdown event.

The path along which the charge carriers flow from the source region 40 to the drain region 42 passes through a drift region 58 in the semiconductor substrate 22. The drift region 58 may be configured to allow the charge carriers to drift under the electric field established by the drain-source voltage applied between the drain region 42 and the source region 40. In this example, the drift region 58 includes an n-type well. The drain region 42 is formed on or otherwise above the drift region 58. A junction forms between the n-type well and the p-type epitaxial layer 24 to establish a RESURF effect directed to decreasing the electric field in areas in and/or around the drift region 58 to increase the intrinsic breakdown voltage (BVdss). One or more other regions may be incorporated into, or adjacent to, the drift region 58 to further reduce the electric field along or near the STI regions 50 to avoid HCI effects and/or breakdown therein. The location of the STI region 50 defines further portions of the conduction path or region(s) of the device 20 between the source and drain regions 40, 42. This portion of the conduction path of the device 20 is within the drift region 58, outside of the channel region 56. Nonetheless, breakdown events along this portion of the conduction path are also prevented as described below.

The drain region 42 is electrically tied or coupled to the isolating regions, as schematically shown as a dashed line in FIG. 1. The coupling may include a metal line 62. The drain bias voltage is thus applied to the isolating region(s) of the device 20 via the isolation contact region or electrode 52 for the isolation well 32. In this example, the isolation well 32 is connected to the NBL 30 via the link region 34, such that the NBL 30 and the link region 34 are also biased at the drain operational voltage. The isolating regions are thus biased relative to the semiconductor substrate 22 via the drain operational voltage and the voltage applied to the semiconductor substrate at the substrate contact region 54.

The biasing of the isolating regions also defines reverse-biased junctions between the isolating regions and the body region 36. With the drain region 42 tied to the isolating regions, junctions involving any of the isolating regions experiences the same voltage applied to the drain region 42. The drain voltage may thus be clamped (e.g., in a parallel configuration) to the voltage across such junctions. In this example, a junction involving the NBL 30 is formed along an interface 66 between the NBL 30 and the p-type epitaxial layer 24. With the NBL 30 tied to the drain region 42, the junction is reverse biased relative to the body region 36. The interface 66 (and/or the regions defining the interface 66) are configured such that the junction experiences breakdown before the above-described conduction regions of the device 20. The breakdown voltage of the junction at the interface 66 is thus set to a level higher than the drain-source operational voltage (e.g., 80 Volts) but lower than the breakdown voltage of the device 20 in the conduction path (e.g., 95 Volts), which may be referred to as the intrinsic breakdown voltage level of the device 20. The breakdown voltage at the interface 66 (or other interface involving the isolating regions of the device 20) may be referred to as an extrinsic breakdown voltage level of the device 20.

The interface 66 defines an integrated breakdown protection diode 68 of the device 20. FIG. 1 includes a symbolic depiction of the integrated breakdown protection diode 68. The symbolic depiction of a protection diode in any of the drawing figures is accordingly not intended to denote any additional semiconductor region, arrangement, or configuration beyond or in addition to the depicted semiconductor structures and/or regions. With the junction 66 oriented laterally across the active area 28 of the device 20, the integrated breakdown protection diode 68 is oriented vertically as shown. The terminals of the protection diode 68 are effectively tied or clamped (as described above) to the body and drain terminals of the device 20 to provide the breakdown protection. The device 20 may include any number of such breakdown protection diodes 68.

In the example shown in FIG. 1, the extrinsic breakdown voltage level is set to an appropriate level via a modification of the p-type body regions 36 of the device 20. The modification may involve a dopant concentration level adjustment and/or a modification in the shape or size of the body region 36. In this example, each body region 36 includes a p-type well 70 spaced from the NBL 30 to an extent that establishes a breakdown voltage for the junction at the interface 66 between the NBL 30 and the body region 36 lower than a breakdown voltage between, for instance, the drain region 42 and the body region 36 in the conduction path of the device 20. For example, the spacing between the well 70 and the NBL 30 may be about 2 μm. The spacing may vary based on, for instance, one or more of the dopant concentration levels of the well 70, the NBL 30, and the epitaxial layer 24. The well 70 and the NBL 30 may thus define a diode depletion region having the desired breakdown voltage.

The body region 36 may be configured as a non-uniform or composite region of outer and inner wells corresponding with the well 70 and a well 72 adjacent to the well 70, respectively. The well 70 may be disposed laterally outward of the well 72, or otherwise disposed closer to the lateral periphery of the active area 28. The source region 40 is disposed on or otherwise above the well 72. In one example, a low voltage p-type well implantation procedure is implemented to dope the outer side of the body region 36 to form the well 70. As described below, the implantation procedure may already be implemented in connection with the formation of a p-type region of a logic device (e.g., CMOS) formed in the semiconductor substrate 22 and/or in connection with the formation of one or more p-type wells 74 in the semiconductor substrate 22 outside of the active area 22. The well 70 accordingly has a depth in common with the well 74 as shown. In some cases, the well(s) 74 are directed to biasing the original substrate 26. For ease in illustration, the depicted well 74 is intended to alternatively or additionally be schematically indicative of the p-type region of the logic transistor or other device (e.g., CMOS device) also formed in the semiconductor substrate 22. The logic device and the device 20 may form parts of one or more electronic circuits having any number of logic and power devices arranged in an electronic apparatus.

The positioning of the well 70 may ensure that the vertical diode 68 formed by the well 70 and the NBL 30 is not in the normal current conduction path of the device 20. The implantation procedure may be configured to establish the depth and/or dopant concentration of the well 70 to establish the extrinsic breakdown voltage at a level between the intrinsic breakdown voltage (e.g., BVdss) and the operational voltage of the device 20. In this example, the well 70 has a greater depth than the well 72. The well 70 may also have a different dopant concentration level than the well 72. As a result of the different depths and/or non-uniform dopant concentration levels, the breakdown voltage of the junction between the well 72 and the NBL 30 may be tuned to protect the channel or conduction path of the device 20.

The well 70 and other components of the protection diode 68 are spaced from the source and channel regions 40, 56 by the remainder of the body region 36 (e.g., the well 72). Each well 70 is thus separated or spaced from the conduction regions of the device 20. The separation or spacing is sufficient to avoid damage to the conduction regions in the event of a breakdown at the interface 66. In this example, each p-type well 70 is disposed under the body contact region 38 laterally outward of such conduction regions of the device 20 and adjacent the lateral isolating regions of the device 20, such as the ring-shaped isolation well 32 and/or the link region 34.

The nature of the modifications to, or non-uniformity of, the body region 36 may vary from the example shown. Alternatively or additionally, other regions of the device 20 may be modified or otherwise configured to be non-uniform to establish a desired breakdown voltage level. For example, the effective shape or size of the NBL 30 may be modified via, for instance, an n-type region disposed above the NBL 30. In other examples, the diode is laterally oriented and formed in connection with an isolating region, such as the ring-shaped well 32 or other region surrounding the active area 28 and spaced from the body region 36. Details regarding these and other examples are provided below. Any combination of the modifications may be incorporated into alternative embodiments.

The device 20 is shown in simplified form and, thus, FIG. 1 does not show the conductive (e.g., ohmic) contacts and other metal layers configured for electric coupling with the source regions 40, the drain regions 42, and the gate structures 44. The device 20 may have a number of other structures or components for connectivity, isolation, passivation, and other purposes not shown in FIG. 1 for ease in illustration. For instance, the device 20 may include any number of additional isolating regions or layers. In some examples, another p-type epitaxial layer (not shown) may be configured as a p-type buried layer. One or more further STI regions, isolation trenches, and/or isolation wells (not shown) may be provided to isolate the active area 28 and/or other region of the device 20.

FIGS. 2-5 depict a number of alternative embodiments of the disclosed devices, each having a breakdown protection diode or junction. In each embodiment, one or both of the regions defining the diode or junction are configured to establish a breakdown voltage level to protect the conductive regions of the device. The configuration of such region(s) may utilize a pre-existing step or procedure (e.g., a dopant implant) in a fabrication process. The different embodiments utilize different pre-existing steps or procedures. The breakdown protection achieved by the disclosed devices may thus be provided under a variety of fabrication processes (or process technologies) without requiring any additional implants or other procedures.

The embodiments of FIGS. 2-5 provide further examples of vertically oriented, integrated breakdown protection diodes (or laterally oriented junctions). Thus, the location of the junction is not affected by a photolithographic misalignment and the protection diodes also scale with device width or size. As in the example of FIG. 1, the diode or junction is formed in these embodiments between an isolating region and a body region (or a portion or extension of such regions). The spacing between the isolating region and the body region may vary in these embodiments, and may vary from the example of FIG. 1. The embodiments of FIGS. 2-5 may have a number of other aspects, components, regions, and other characteristics in common with the embodiment of FIG. 1.

Figure 2:
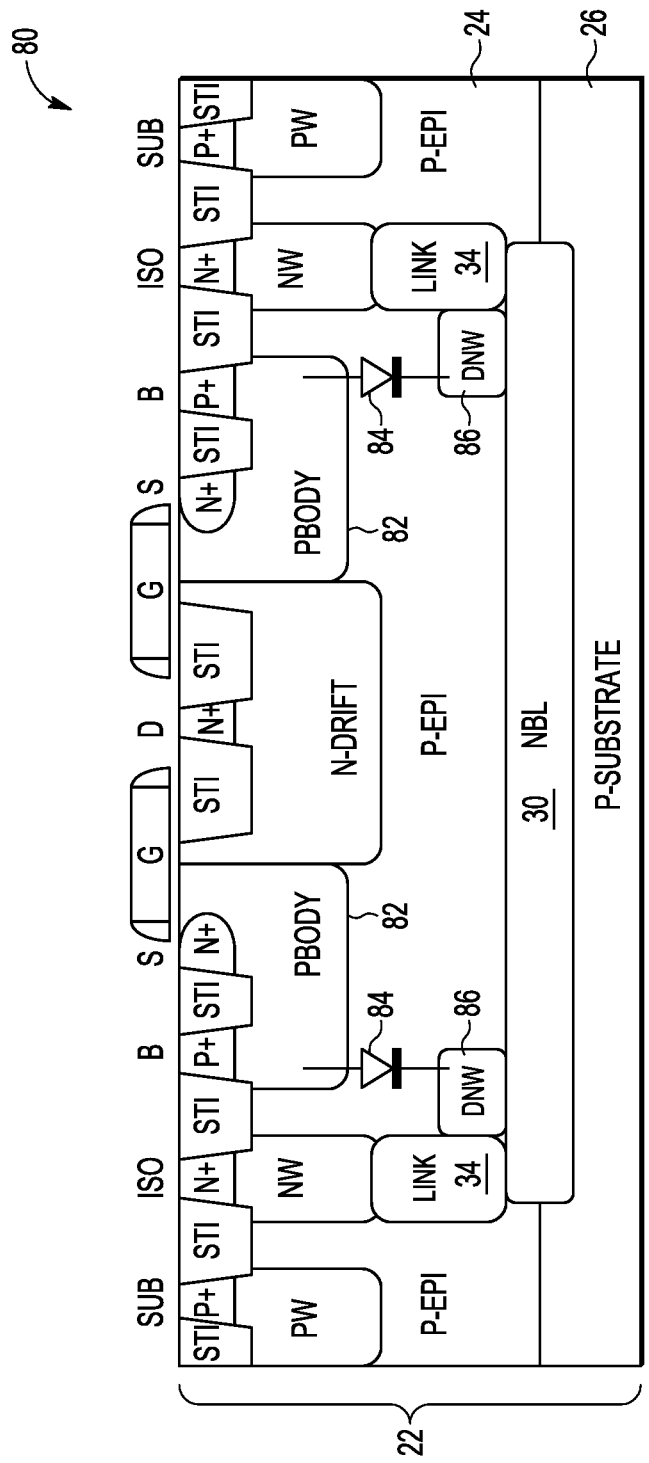

FIG. 2 depicts a device 80 with integrated breakdown protection despite having a non-composite body region 82. The body region 82 may be uniform in the lateral direction, but may include a non-constant dopant concentration in the vertical direction. Configuration of a vertically oriented protection diode 84 is achieved via an extension of an isolating region. In this embodiment, the isolating regions of the device 80 include a deep n-type well 86 formed in the semiconductor substrate 22 adjacent one or more of the above-described isolating regions. For example, the deep n-type well 86 is adjacent one or both of the link region 34 and the NBL 30. The link region 34 and the deep n-type well 86 may be ring-shaped like the isolation well 32. In some cases, the deep n-type well 86 is formed during an implant procedure also directed to the formation of a well (not shown) of corresponding depth in connection with a logic transistor disposed in the semiconductor substrate 22. The depth, dopant concentration level, width, position relative to the body region 82, and other characteristics of the deep n-type well 86 may be configured to set the breakdown voltage of the breakdown protection diode 84. For example, a top of the deep n-type well 86 may have a depth to adjust a spacing between the deep n-type well 86 and the body region 82. The spacing may be similar to, or vary from, the example of FIG. 1 based on, for instance, the respective dopant level concentrations. In some examples, the depth and/or other characteristics of the body region 82 may additionally be adjusted to set the breakdown voltage at a desired level.

Figure 3:
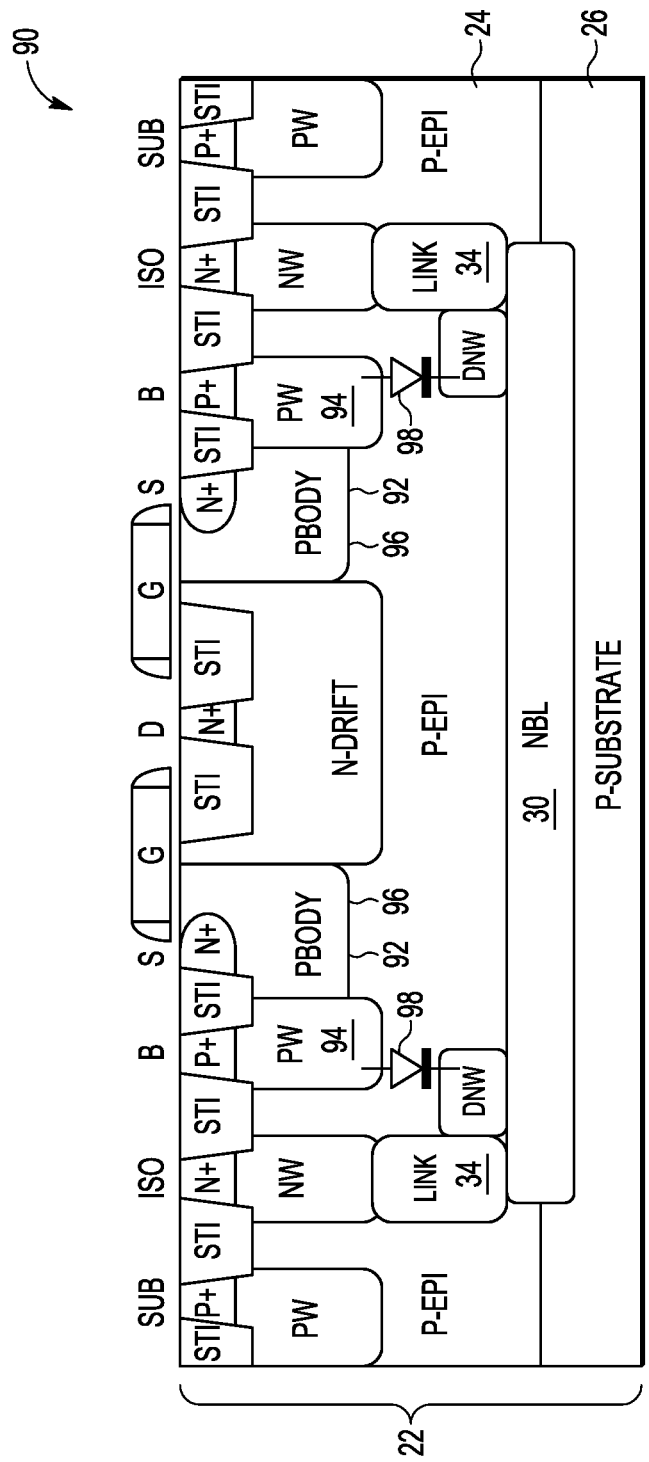

With reference to FIG. 3, a device 90 is one example where a body region 92 is also modified to set the extrinsic breakdown voltage level. The body region 92 is non-uniform, having an outer well 94 and an inner well 96, as in the example of FIG. 1. Additional or alternative wells or regions may be provided in the body region 92. In this example, the outer well 94 defines one or more vertically oriented protection diodes 98 having lateral junction(s) with the deep n-type well 86 rather than the NBL 30. The breakdown voltage of the protection diodes 98 may be set through adjustments to either one or both of the pre-existing fabrication procedures leading to the formation of such regions in other devices (e.g., logic transistors). The flexibility provided by adjusting both of the procedures may be useful to achieve, for instance, a desired spacing between the regions defining the diode 98 (e.g., the deep n-type well 86 and the outer well 94 of the body region 92). Such flexibility may be useful in those cases where the desired spacing may not be easily achieved via an adjustment to only one of the regions. Adverse effects on the other devices (e.g., logic transistors) formed by the procedure may thus be avoided.

Figure 4:
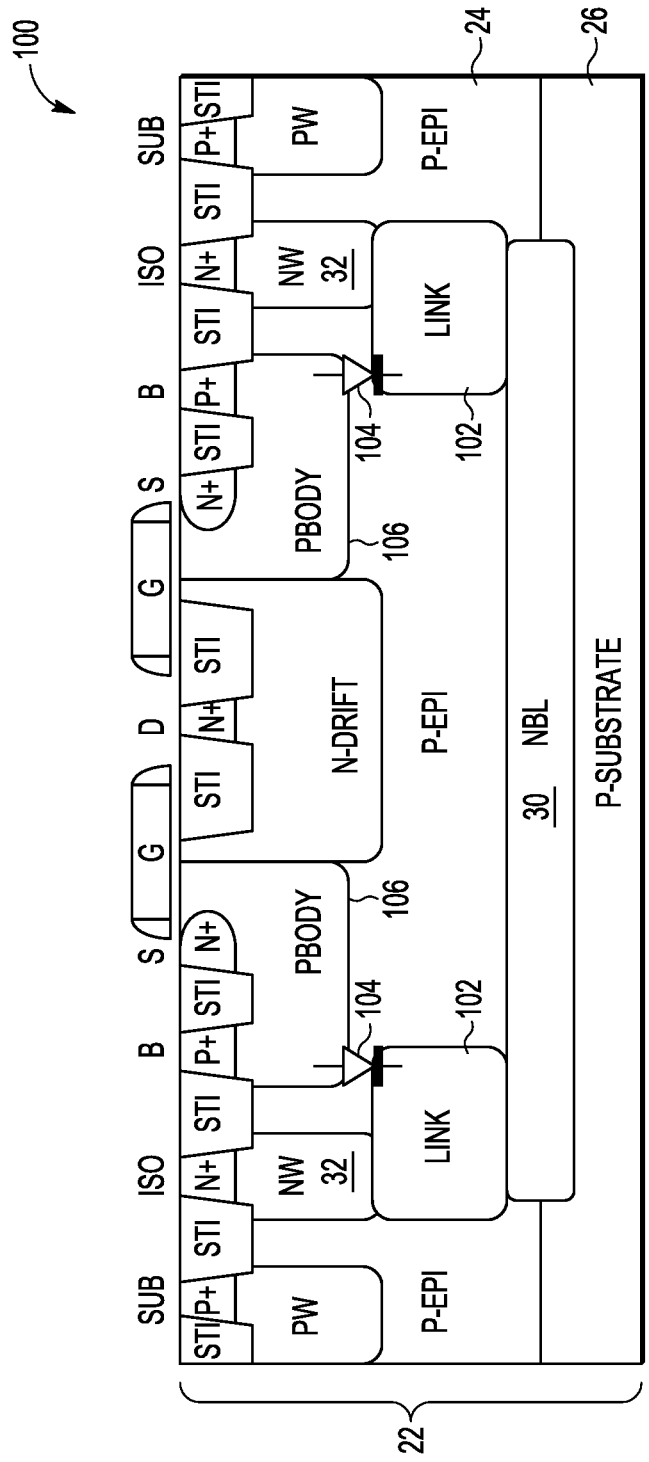

FIG. 4 depicts an alternative embodiment in which a device 100 includes one or more isolation link regions 102 configured to form one or more vertically oriented diodes 104. The isolation link regions 102 may be configured as a ring surrounding the active area of the device 100 or as a number of discrete regions coupling the isolation well and the NBL 30. In either case, the lateral extent of the isolation link region(s) 102 is modified relative to the examples described above. In this example, the isolation link region(s) 102 extends laterally inward beyond the isolation well 32. A body region 106 may thus be formed above the isolation link region(s) 102. The diode(s) 104 are defined where the isolation link region(s) 102 and the body region 106 overlap. The overlap may be configured (e.g., limited) to an outer portion of the body region 106 such that the area in which breakdown occurs is sufficiently spaced from the conduction path of the device 100. The amount of overlap may vary. The breakdown voltage of the diode(s) 104 may be established by adjusting a spacing between the isolation link region(s) 102 and the body region 106. The dopant concentration levels in the isolation link region(s) 102 and the body region 106 may also be configured to establish a desired breakdown voltage of the diode(s) 104.

Figure 5:
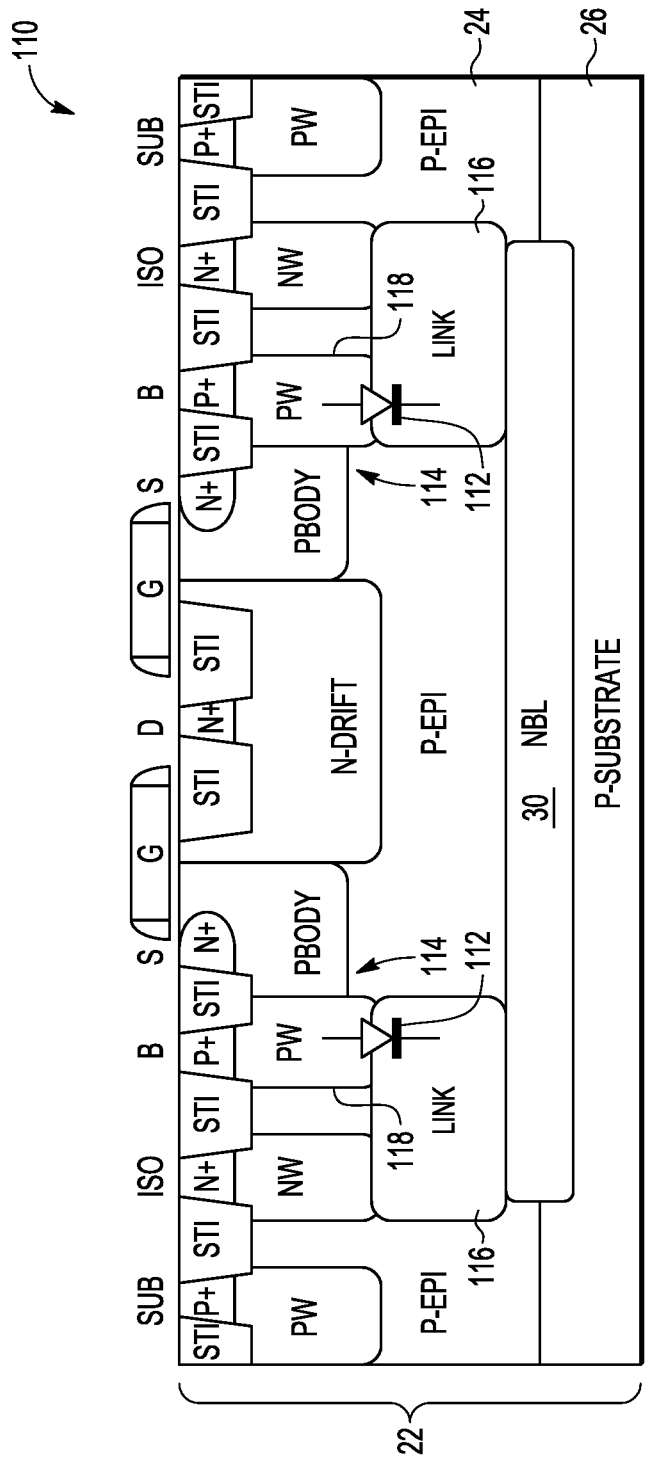

FIG. 5 depicts a device 110 having one or more protection diodes 112 formed via a non-uniform body region 114 and one or more laterally extended isolation link regions 116. This embodiment provides another example of how one or more aspects of the embodiments described herein may be combined to establish a desired breakdown voltage. The non-uniform body region 114 may be configured as described above in connection with the embodiments of FIGS. 1 and 3. The isolation link region(s) 116 may be configured as described above in connection with the embodiment of FIG. 4. The non-uniform body region 114 may include a p-type well region 118 having a depth to adjust or configure the spacing between the well region 118 and the isolation link region(s) 116. In this example, the protection diode(s) 112 are formed along a lateral junction defined between the well region 118 and the isolation link region(s) 116. The lateral junction need not extend the entire width of the well region 118 as shown. The overlap of the isolation link region(s) 116 and the well region 118 may vary.

Testing of an exemplary power transistor device (e.g., an n-type channel LDMOS device) configured with an integrated protection diode as described above shows that device performance does not degrade after numerous breakdown events. In this example, the integrated protection diode is formed between the well region of a non-uniform body region and an NBL region, as shown in FIG. 1. A drain terminal of the LDMOS device is tied to the isolating regions of the device to clamp the integrated protection diode to the device terminals and reverse bias the junction of the integrated protection diode. The test data shows that adding the integrated protection diode in this manner does not change the off-state or on-state operational characteristics of the LDMOS device, such as the threshold voltage (Vt), the drain-source resistance (Rdson), or other aspects of the current-voltage, or Id-Vd, characteristic of the LDMOS device. The test data also shows that these characteristics of the LDMOS device remain unaffected after repeated breakdown of the protection diode. The diode breakdown is thus non-destructive and repeatable. The data shows no shift or degradation in the characteristics of the LDMOS device after multiple breakdown events. As described above, the breakdown voltage of the integrated protection diode is adjusted to a desired level below the intrinsic BVdss of the LDMOS device.

These results may be achieved in a manner transparent to design and modeling. No additional fabrication process steps or procedures are involved. In this example, the only modification to the fabrication process involves a single mask change to form the outer well of the non-uniform body region. The implant procedure implemented with the modified mask may be directed to forming one or more p-type regions of other devices (e.g., logic transistor devices, such as CMOS devices). The integrated nature of the protection diode allows the footprint and routing of the LDMOS device to remain unchanged.

FIGS. 6-9C are directed to further examples of power transistor devices configured with integrated protection diodes. In these examples, each protection diode is oriented laterally within the power transistor device. The junction of the protection diode is vertical rather than lateral (as in the above-described examples). The protection diodes are again defined between an isolating region and a body region, with the location of the protection diode and the nature of the isolating region and the body region varying among the examples. The power transistor devices of FIGS. 6-9C may be otherwise configured in a manner similar to the embodiments described above.

Figure 6:
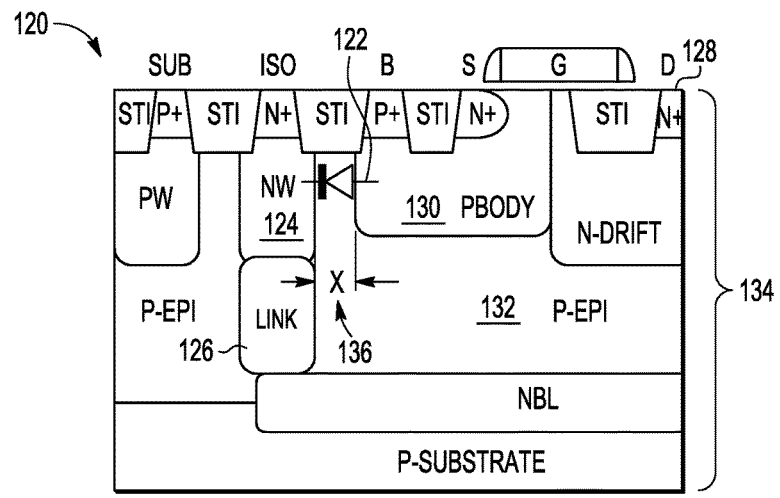
FIGS. 6-8 are cross-sectional, schematic views of exemplary n-channel LDMOS transistors with integrated breakdown protection diodes in accordance with several further embodiments.

FIG. 6 depicts an LDMOS device 120 with a laterally oriented protection diode 122 integrated within the device 120. The device 120 is isolated via a ring-shaped isolation well 124 and a link region 126, each of which may be electrically shorted with a drain region 128. The isolation well 124 and the link region 126 are spaced from a device body region 130. As in the embodiments described above, these regions of the device 120 are formed in a p-type epitaxial region 132 of a substrate 134. A portion 136 of the epitaxial region 132 is disposed between the body region 130 and the ring-shaped isolation well 124. By adjusting the width, $\chi$, of the portion 136 of the epitaxial region 132, the breakdown voltage of the laterally oriented protection diode 122 may be established. The breakdown voltage of the protection diode 122 may be set to a level between the intrinsic breakdown voltage of the device 120 (e.g., BVdss) and the operational voltage (Vop) of the device 120. The width may be adjusted by modifying one or both of the lateral extent of the ring-shaped isolation well 124 and the lateral extent of the body region 130. The portion 136 of the epitaxial region 132 and, thus, the diode 122 is not in the normal conduction path of the device 120. Any eventual breakdown is thus non-destructive to normal operation of the device 120. In one example, the width, $\chi$, is about 2 μm. The width, $\chi$, may vary based on a number of factors, such as the dopant level concentrations of one or more of the body region 130, the ring-shaped isolation well 124, and the epitaxial region 132. Like the examples described above, the integrated location of the protection diode 122 allows the protection diode 122 to scale with the width of the LDMOS device 120.

Figure 7:
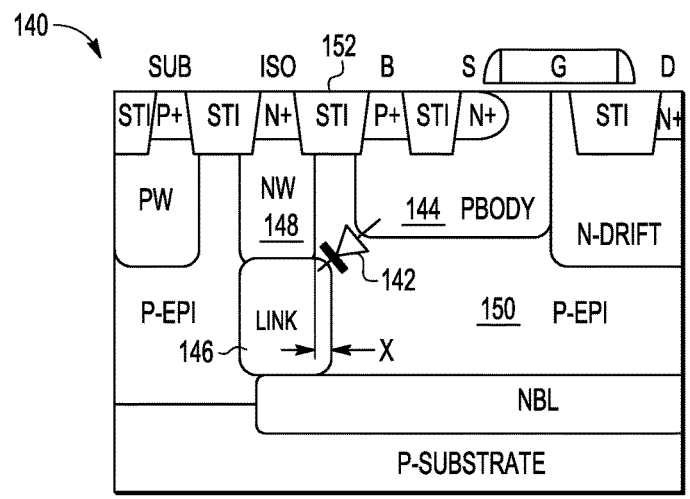

FIG. 7 depicts another exemplary LDMOS device 140 in which a protection diode 142 is defined between a body region 144 and an isolation link region 146. The protection diode 142 may be oriented on a diagonal line in this embodiment. The orientation may thus include a lateral component. Unlike the embodiments of FIGS. 4 and 5, the body region 144 is not formed above the isolation link region 146. No portion of the isolation link region 146 overlaps the body region 144. The body region 144 is instead laterally spaced from the isolation link region 146. The width of the isolation link region 146 exceeds the width of a ring-shaped isolation well 148 by an inner extension distance χ. In one example, the distance is about 1 μm. A p-type epitaxial region 150 in which these regions are formed is again disposed between the body region 144 and the link region 146 to establish a desired breakdown voltage level. The distance between the link region 146 and the body region 144 may be adjusted to obtain a desired diode breakdown voltage. By adjusting the inner extension distance χ of the link region 146 relative to the ring-shaped well region 148, the location of the breakdown may be established along the diagonal direction between the link region 146 and the body region 144. The location of the breakdown may be lower than the breakdown location in the embodiment of FIG. 6. The breakdown may thus occur at a greater depth below an STI region or oxide trench 152. Charge trapping in the trench oxide may thus be avoided during a breakdown event.

Figure 8:
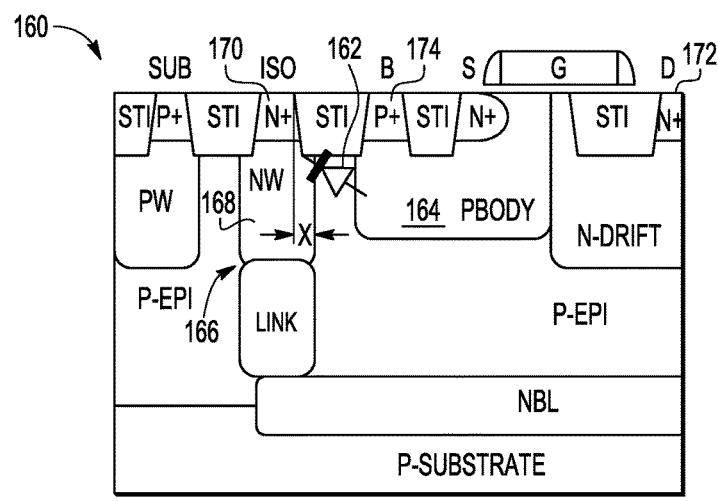

FIG. 8 depicts yet another exemplary LDMOS device 160 having a protection diode 162 defined between a body region 164 and an isolating region 166. The isolating region may include a ring-shaped well 168 on or otherwise above which a contact or electrode region 170 is formed. The contact region 170 may be used to tie or short the isolating region 166 with a drain region 172. Upon application of the drain bias voltage, the depletion region of the protection diode 162 is formed between the isolating region 166 and the body region 164. The isolating region 166 and the body region 164 may be configured such that the depletion region reaches the contact region 170 at the breakdown voltage of the protection diode 162. For instance, the breakdown voltage of the protection diode 162 may be established by adjusting the ring-shaped well 168 such that the depletion region in the well 168 reaches through and touches the contact region 170 under sufficiently high reverse bias. In this example, the lateral width, dopant concentration, and/or other characteristic of the ring-shaped well 168 is configured such that the depletion region reaches a distance χ. In one example, the distance is about 0.5 μm. Alternatively or additionally, the lateral width, dopant concentration, or other characteristic of the body region 164 is adjusted such that the depletion region of the protection diode 162 reaches a body contact region 174 formed on or otherwise above a well that defines the body region 164 at the breakdown voltage of the protection diode 162. Thus, diode breakdown may occur when the depletion region reaches through and touches either electrode (or contact region) of the regions forming the protection diode 162.

Figure 9A:
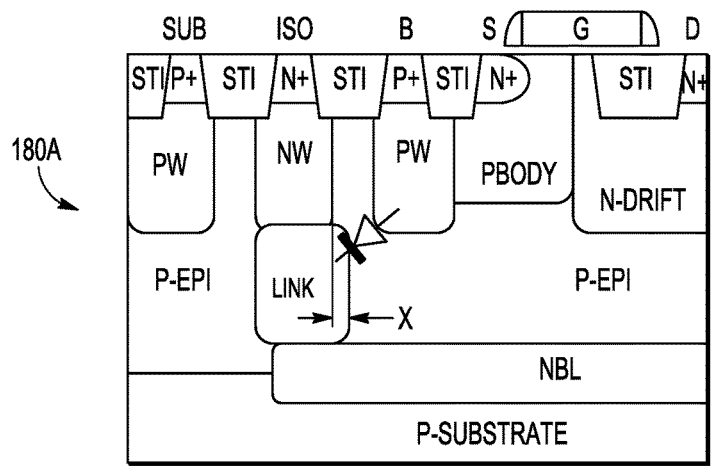
FIGS. 9A-9C are cross-sectional, schematic views of exemplary n-channel LDMOS transistors with integrated breakdown protection diodes in accordance with still further embodiments.
Figure 9B:
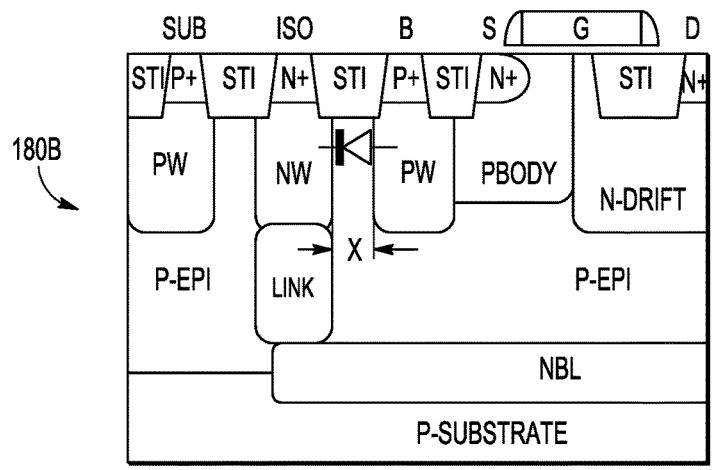
Figure 9C:
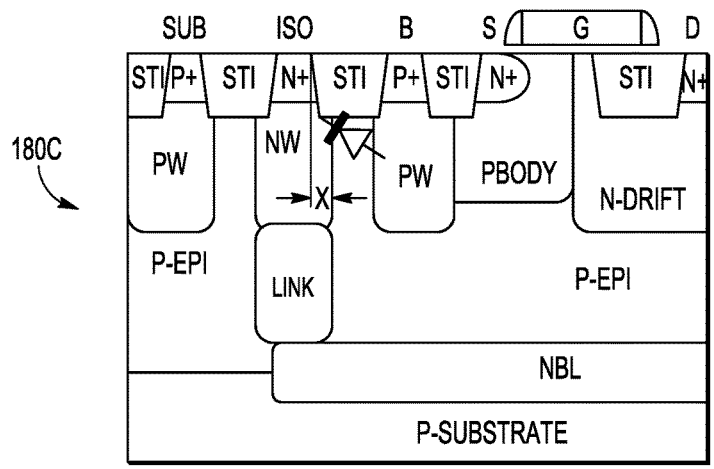

With reference to FIGS. 9A-9C, several exemplary LDMOS devices 180A-180C are configured with integrated protection diodes. Each device 180A-180C has a non-uniform body region similar to those described above in connection with the embodiments of FIGS. 1, 3, and 5. Unlike those embodiments, the protection diodes of the devices 180A-180C are laterally oriented. The protection diodes are formed via the spacing between the non-uniform body region and one of the isolating regions as described above in connection with the embodiments of FIGS. 6-8. The spacing may be similar to one of the examples described above. As described above, each non-uniform body region may include an outer well and an inner well. An additional implant procedure may be implemented to form the outer well. The outer well may extend to a greater depth than the inner well. The greater depth may reduce the diode series resistance and/or provide better control of the breakdown voltage of the protection diode.

Testing of an exemplary LDMOS device having a laterally oriented, integrated protection diode show that device performance is not adversely affected by breakdown events involving the diode configuration of FIG. 6. After six breakdown events, there is no shift or degradation in the electrical characteristics of the LDMOS device. Further testing shows how the breakdown voltage of the protection diode is tunable. The breakdown voltage is established at varying voltage levels based on different spacing (the distance χ) between the isolation and body regions forming the protection diode. The operational characteristics of the LDMOS device are also shown to be not adversely affected by the integration of the laterally oriented protection diode within the LDMOS device. The laterally oriented protection diode is also integrated without any additional process cost.

The dopant concentrations, thicknesses, and other characteristics of the other above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
| --- | --- | --- |
| p-epi 24: | $1 \times 10^{15}/cm^3$ | 5 μm |
| substrate 26: | $1 \times 10^{15}/cm^3$ | not applicable |
| NBL 30 | $5 \times 10^{18}/cm^3$ | 1 μm |
| isolation well 32: | $1 \times 10^{17}/cm^3$ | 1 μm |
| link region 34: | $1 \times 10^{17}/cm^3$ | 3 μm |
| body 36: | $1 \times 10^{17}/cm^3$ | 1 μm |
| source 40: | $1 \times 10^{21}/cm^3$ | 0.25 μm |
| drain 42: | $1 \times 10^{21}/cm^3$ | 0.25 μm |

The concentrations and thicknesses may be different in other embodiments. For example, the dopant concentration of the original substrate 26 may vary considerably.

Figure 10:
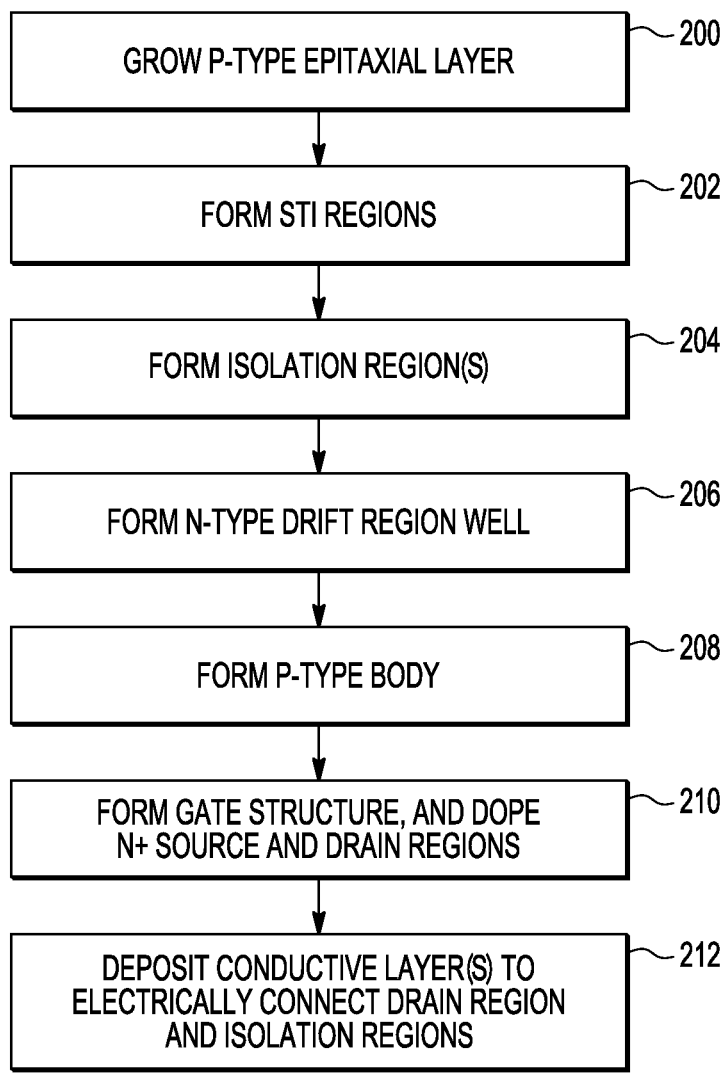
FIG. 10 is flow diagram of an exemplary fabrication sequence to construct an n-channel LDMOS transistor with an integrated breakdown protection diode in accordance with one embodiment.

FIG. 10 shows an exemplary fabrication method for fabricating a power transistor device with an integrated protection diode as described above. The method may be directed to fabricating a reduced surface field (RESURF) LDMOS transistor having one or more of the features described above. The transistor is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. The fabrication method is not limited to any particular doping mechanism, and may include future developed doping techniques.

The method may begin with, or include, an act 200 in which a p-type epitaxial layer (p-epi) is grown on a p-type semiconductor substrate, which may be heavily doped in some cases. As described above, the epitaxial layer is optional. An n-type buried layer (NBL) may be formed via, e.g., ion implantation, in the epitaxial layer in act 202. The buried layer may be configured via a mask to extend across an active area of the LDMOS transistor. In some cases, the act 202 is followed by the growth of another p-type epitaxial layer. Any number of epitaxial layers may be grown to define the semiconductor substrate in which a number of device regions of the device are formed.

Any number of STI regions may be grown or otherwise formed in act 202 at the surface of the semiconductor substrate. Alternatively, the STI regions are formed after one or more of the regions in the epitaxial layer are formed. The STI regions may be formed via any now known or hereafter developed procedure. For example, the procedure may include the formation of a trench and the deposition (e.g., chemical vapor deposition, or CVD) of one or more materials in the trench. In some embodiments, the trench is filled with silicon oxide. Additional or alternative materials may be deposited.

In act 204, a number of n-type device isolating regions are formed in the semiconductor substrate to define an active area of the device. As in the examples described above, a ring-shaped isolation well and one or more link regions may be formed. In an alternative embodiment, the NBL layer may be formed at this time rather than in act 200. In one example, each isolating region is formed during a respective ion implantation procedure configured via a mask, which may also be directed to the formation of one or more n-type regions of non-power transistor devices disposed in the semiconductor substrate, such as a CMOS device. For example, the isolating regions may include a deep n-type well (see, e.g., FIGS. 2 and 3), the implantation mask for which may be configured to form a region of another device at a similar depth.

In act 206, an additional n-type region is formed in the epitaxial layer via another implantation procedure. The additional n-type region may correspond with a drift region of the device. Alternatively, the drift region may be formed at the same time as one of the isolating regions in act 204.

A p-type body region may be formed in act 208. As described above, the body region and at least one of the device isolating regions are spaced from one another to establish an extrinsic breakdown voltage between the device isolating region and the body region lower than an intrinsic breakdown voltage of the device in the conduction path of the device. In cases where the body region is non-uniform, the act 208 may include multiple implantation procedures. For example, the body region may be formed by implanting p-type dopant in an inner well region (on which a source region is later formed) and by implanting p-type dopant in an outer well region adjacent the inner well region. The inner well region may extend and overlap with the outer well region to any desired extent. In one example, the inner well region may cover or extend across the entire body region. The outer well region may be spaced from at least one of the device isolating regions to establish the breakdown voltage of the protection diode. The inner and outer wells may have different dopant concentration levels. The outer well may be formed during an implantation procedure that also forms a well of a logic transistor fabricated in the semiconductor substrate. The point at which the implantation procedure(s) are implemented may vary. Either one of the implantation procedures may be additionally directed to the formation of a p-type region of another device.

The fabrication process may include one or more procedures collectively shown in act 210. A gate structure is formed. N-type source and drain regions may then be formed in, on, or otherwise above the body and drift regions, respectively. One or more implantation procedures may be implemented, using the gate structure for self-alignment. For example, formation of one or both of the source region and the drain region may include a moderate implant before formation of sidewall spacers of the gate structure to create one or more transition regions (e.g., NLDD regions). A heavy implant after formation of the sidewall spacers may then be implemented to form the source and/or drain regions adjacent to such transition regions. A heavily doped p-type contact region for the device body may be formed in the well via a separate ion implantation procedure. The drain region is spaced from the body region by the drift region and other parts of the conduction path (e.g., the accumulation region). As described above, the drift region and other parts of the conduction path are spaced from the integrated protection diode(s) defined between the isolating region(s) and the body region.

One or more metal or other conductive layers may then be deposited or otherwise formed in act 212 to, for instance, short or electrically connect the drain region and the device isolating regions. The composition of the metal layer(s) may vary considerably. The manner in which the metal layer(s) are formed may also vary.

Additional acts may be implemented at various points during the fabrication procedure. For example, one or more acts may be directed to defining an active area of the device. In some cases, such acts may include the formation of a device isolation well. One or more metal layers may be deposited.

The above-described transistor devices are configured such that breakdown events occur at locations other than, outside of, or otherwise spaced from, the conduction region(s) or path(s) of the device, despite the integrated nature of the breakdown protection diodes. The diodes may be oriented laterally or vertically within the transistor device. The orientation options may provide design flexibility for utilizing preexisting fabrication procedures to form and tune the diodes. The protection diodes are engineered to have a breakdown voltage slightly below the intrinsic breakdown voltage (BVdss) of the device to ensure breakdown always occurs at the protection diode. As described above, the breakdown voltage of the protection diodes may be tunable by adjusting the location, spacing, or dopant concentration levels of the regions defining the diode. With the drain and the isolating regions tied to one another, the drain voltage is clamped at the breakdown voltage of the protection diode. The transistor device may thus avoid entering the BVdss condition. With the protection diode spaced away from the normal current conduction path of the transistor device, the diode breakdown avoids causing destruction or degradation of device performance, such as the device I-V characteristics. With the integration of the protection diode, the size of the protection diode scales with the transistor device, thereby maintaining protection effectiveness when the width of the transistor device changes. These and other advantages may be achieved in a manner transparent to design and modeling. The protection diodes may be formed without any additional fabrication process steps, without any process modifications other than a mask layout change, and without any additional device footprint or area.

In a first aspect, a device includes a semiconductor substrate having a first conductivity type, a device isolating region in the semiconductor substrate, defining an active area, and having a second conductivity type, a body region in the active area and having the first conductivity type, and a drain region in the active area spaced from the body region to define a conduction path of the device, the drain region having the second conductivity type. The device isolating region and the body region are spaced from one another to establish a first breakdown voltage lower than a second breakdown voltage in the conduction path.

In a second aspect, an electronic apparatus includes a substrate having a first conductivity type, and a transistor disposed in the substrate. The transistor includes a first semiconductor region having a second conductivity type, a second semiconductor region having the first conductivity type, a third semiconductor region having the second conductivity type, adjacent the first semiconductor region, and spaced from the second semiconductor region by the first semiconductor region, and a fourth semiconductor region having the second conductivity type and defining an active area of the transistor in which the first, second and third semiconductor regions are disposed. The second and fourth semiconductor regions are configured to define a diode depletion region having a first breakdown voltage lower than a second breakdown voltage in the first semiconductor region.

In a third aspect, a method of fabricating a transistor includes forming a device isolating region of the transistor in a semiconductor substrate, the substrate having a first conductivity type, the device isolating region having a second conductivity type and defining an active area of the transistor, forming a body region of the transistor in the active area, the body region having the first conductivity type; and forming source and drain regions of the transistor in the active area, the source region being disposed on the body region, the source and drain regions having the second conductivity type. The device isolating region and the body region are spaced from one another to establish a first breakdown voltage lower than a second breakdown voltage in a conduction path between the source and drain regions.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
a semiconductor substrate having a first conductivity type;
a device isolating region in the semiconductor substrate, defining an active area, and having a second conductivity type;
a body region in the active area and having the first conductivity type; and
a drain region in the active area and spaced from the body region to define a conduction path of the device, the drain region having the second conductivity type;
wherein at least one of the body region and the device isolating region comprises a plurality of peripheral, constituent regions disposed along a lateral periphery of the active area, each peripheral, constituent region of the plurality of peripheral, constituent regions defining a non-uniform spacing between the device isolating region and the body region, and
wherein the non-uniform spacing at a respective peripheral region of the plurality of peripheral, constituent regions establishes a first breakdown voltage lower than a second breakdown voltage in the conduction path.

2. The device of claim 1, further comprising a source region in the active area and having the second conductivity type, wherein the body region comprises a first well on which the source region is disposed and a second well adjacent the first well and spaced from the device isolating region to establish the first breakdown voltage.

3. The device of claim 2, wherein the first well and the second well have different dopant concentration levels.

4. The device of claim 2, wherein the device isolating region comprises a buried isolation layer in the semiconductor substrate, extending across the active area, and spaced from the second well of the body region to establish the first breakdown voltage.

5. The device of claim 1, wherein the respective peripheral region comprises an isolation well configured as a ring surrounding the active area and spaced from the body region to establish the first breakdown voltage.

6. The device of claim 1, wherein:
the device isolating region comprises a buried isolation layer in the semiconductor substrate, extending across the active area, and spaced from the body region to establish the first breakdown voltage;
the respective peripheral region is a well of the body region; and
the respective peripheral region is spaced from the buried isolation layer.

7. The device of claim 1, wherein the device isolating region comprises:
a well region disposed in the semiconductor substrate and configured as a ring surrounding the active area;
a buried isolation layer in the semiconductor substrate extending across the active area; and
a link region in the semiconductor substrate coupling the well region and the buried isolating region, the link region extending laterally inward beyond the well region and toward the body region to provide the respective peripheral region.

8. The device of claim 1, wherein:
the device isolating region includes a well and a contact region formed on the well;
the body region includes a well and a contact region formed on the well; and
a depletion region is formed between the device isolating region and the body region that reaches the contact region of either the device isolating region or the body region at the first breakdown voltage.

9. A device comprising:
a semiconductor substrate having a first conductivity type;
a device isolating region in the semiconductor substrate, defining an active area, having a second conductivity type, and comprising a plurality of peripheral, constituent regions disposed along a lateral periphery of the active area;
a body region in the active area and having the first conductivity type; and
a drain region in the active area and spaced from the body region to define a conduction path of the device, the drain region having the second conductivity type;
wherein the device isolating region comprises a plurality of peripheral, constituent regions disposed along a lateral periphery of the active area, each peripheral, constituent region of the plurality of peripheral, constituent regions defining a non-uniform spacing between the device isolating region and the body region, and wherein the non-uniform spacing at a respective peripheral region of the plurality of peripheral, constituent regions establishes a first breakdown voltage lower than a second breakdown voltage in the conduction path.

10. The device of claim 9, further comprising a source region in the active area and having the second conductivity type, wherein the body region comprises a first well on which the source region is disposed and a second well adjacent the first well and spaced from the device isolating region to establish the first breakdown voltage.

11. The device of claim 10, wherein the first well and the second well have different dopant concentration levels.

12. The device of claim 9, wherein the device isolating region comprises a buried isolation layer in the semiconductor substrate, extending across the active area, and electrically coupled to the plurality of peripheral, constituent regions.

13. The device of claim 9, wherein the respective peripheral region comprises an isolation well configured as a ring surrounding the active area and spaced from the body region to establish the first breakdown voltage.

14. The device of claim 9, wherein the respective peripheral region comprises a buried well configured as a ring surrounding the active area and spaced from the body region to establish the first breakdown voltage.

15. The device of claim 9, wherein the respective peripheral region is a ring-shaped well region.

16. The device of claim 9, wherein:
the device isolating region includes a well and a contact region formed on the well;
the body region includes a well and a contact region formed on the well; and
a depletion region is formed between the device isolating region and the body region that reaches the contact region of either the device isolating region or the body region at the first breakdown voltage.

17. The device of claim 9, wherein the device isolating region comprises:
one or more well regions disposed in the semiconductor substrate and configured as a ring surrounding the active area;
a buried isolation layer in the semiconductor substrate extending across the active area; and
a buried well region laterally adjacent the ring and vertically adjacent the buried isolation layer to provide the respective peripheral region.

18. A method of fabricating a transistor, the method comprising:
forming a device isolating region of the transistor in a semiconductor substrate, the substrate having a first conductivity type, the device isolating region having a second conductivity type and defining an active area of the transistor;
forming a body region of the transistor in the active area, the body region having the first conductivity type; and
forming source and drain regions of the transistor in the active area, the source region being disposed on the body region, the source and drain regions having the second conductivity type;
wherein the device isolating region comprises a plurality of peripheral, constituent regions disposed along a lateral periphery of the active area, each peripheral, constituent region of the plurality of peripheral, constituent regions defining a non-uniform spacing between the device isolating region and the body region, and
wherein the non-uniform spacing at a respective peripheral region of the plurality of peripheral, constituent regions establishes a first breakdown voltage lower than a second breakdown voltage in a conduction path between the source and drain regions.

19. The method of claim 18, wherein forming the body region comprises:
implanting dopant of the second conductivity type in a first well region of the body region on which the source region is disposed; and
implanting the dopant of the second conductivity type in a second well region adjacent the first well region and spaced from the device isolating region to establish the first breakdown voltage.

20. The method of claim 18, further comprising a forming a buried isolation layer in the semiconductor substrate, having the first conductivity type, and extending across the active area, wherein forming the device isolating region comprises:
forming a well region in the semiconductor substrate, the well being configured as a ring surrounding the active area; and
forming a link region in the semiconductor substrate coupling the well region and the buried isolating region, the link region extending laterally inward beyond the well region and toward the body region to provide the respective peripheral region.

* * * * *